(12) United States Patent
Stapleton et al.

(10) Patent No.: US 10,971,892 B2
(45) Date of Patent: Apr. 6, 2021

(54) HIGH POWER CAVITY PACKAGE FOR LIGHT EMITTERS

(71) Applicant: FINISAR CORPORATION, Sunnyvale, CA (US)

(72) Inventors: Brent Stapleton, Sherman, TX (US); Pritha Khurana, Allen, TX (US); Nathan Lye, Anna, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/533,721

(22) Filed: Aug. 6, 2019

(65) Prior Publication Data

US 2020/0028320 A1 Jan. 23, 2020

Related U.S. Application Data

(63) Continuation of application No. 15/809,733, filed on Nov. 10, 2017, now Pat. No. 10,374,387.

(51) Int. Cl.
| | |
|---|---|
| *H01S 5/022* | (2021.01) |
| *H01S 5/42* | (2006.01) |
| *H01S 5/024* | (2006.01) |
| *G03B 21/20* | (2006.01) |
| *H01S 5/02208* | (2021.01) |
| *H01S 5/183* | (2006.01) |
| *H01S 5/026* | (2006.01) |
| *H01L 25/065* | (2006.01) |

(52) U.S. Cl.
CPC ...... *H01S 5/02296* (2013.01); *G03B 21/2033* (2013.01); *H01S 5/02208* (2013.01); *H01S 5/02469* (2013.01); *H01S 5/18308* (2013.01); *H01S 5/18361* (2013.01); *H01S 5/423* (2013.01); *H01L 25/0655* (2013.01); *H01L 2224/293* (2013.01); *H01L 2224/2929* (2013.01); *H01L 2224/32013* (2013.01); *H01L 2224/32225* (2013.01); *H01L 2224/45099* (2013.01); *H01L 2224/48106* (2013.01);

(Continued)

(58) Field of Classification Search
CPC .. H01S 5/02296; H01S 5/02469; H01S 5/423; H01S 5/18361; H01S 5/18308; H01S 5/02208; H01S 5/02276; H01S 5/026; H01S 5/02228; H01S 5/0226; G03B 21/2033; H01L 2224/48106; H01L 2924/15153; H01L 2224/48233; H01L 25/0655; H01L 2224/293; H01L 2224/45099; H01L 2224/2929; H01L 2924/1715; H01L 2224/32013; H01L 2224/32225;

(Continued)

(56) References Cited

U.S. PATENT DOCUMENTS 4,115,837 A * 9/1978 Beall ............... H01L 23/057
257/712
4,340,902 A * 7/1982 Honda ............. H01L 23/047
174/547

(Continued)

*Primary Examiner* — Yuanda Zhang
(74) *Attorney, Agent, or Firm* — Blank Rome LLP

(57) ABSTRACT

An emitter package can include: a body having a bottom member, side members extending from the bottom member, and a top surface, wherein the body defines a cavity formed into the top surface and located between the bottom member and side members; the cavity having top side walls extending from the top surface to optic shelves, middle side walls extending from the optic shelves to contact shelves, and bottom side walls extending from the contact shelves to a base surface; electrical conductive pads on the base surface in the cavity; emitter chips on the electrical conductive pads, each emitter chip having one or more light emitters; shelf contact pads on the contact shelves; and electrical connector wires connected to and extending between the emitter chips and the shelf contact pads.

19 Claims, 11 Drawing Sheets

(52) U.S. Cl.
CPC ........... *H01L 2224/48227* (2013.01); *H01L 2224/48233* (2013.01); *H01L 2224/49173* (2013.01); *H01L 2224/49176* (2013.01); *H01L 2224/49177* (2013.01); *H01L 2924/15153* (2013.01); *H01L 2924/1715* (2013.01); *H01S 5/026* (2013.01); *H01S 5/0226* (2013.01); *H01S 5/02228* (2013.01); *H01S 5/02276* (2013.01)

(58) Field of Classification Search
CPC . H01L 2224/49173; H01L 2224/49177; H01L 2224/48227; H01L 2224/49176
See application file for complete search history.

(56) References Cited

U.S. PATENT DOCUMENTS

| | | | | | |
|---|---|---|---|---|---|
| 4,654,694 | A | * | 3/1987 | Val | H01L 23/642 |
| | | | | | 174/559 |
| 4,839,717 | A | * | 6/1989 | Phy | H01L 23/057 |
| | | | | | 257/664 |
| 5,159,750 | A | * | 11/1992 | Dutta | H01L 23/047 |
| | | | | | 174/538 |
| 5,764,484 | A | * | 6/1998 | Hoffman | H01L 23/13 |
| | | | | | 174/521 |
| 2007/0126010 | A1 | * | 6/2007 | Chua | H01L 31/02327 |
| | | | | | 257/79 |
| 2010/0091633 | A1 | * | 4/2010 | Furuyashikil | G11B 7/123 |
| | | | | | 369/112.23 |
| 2013/0301257 | A1 | * | 11/2013 | Britt | H01L 25/0753 |
| | | | | | 362/231 |
| 2015/0168659 | A1 | * | 6/2015 | Lai | G02B 6/421 |
| | | | | | 385/14 |

* cited by examiner

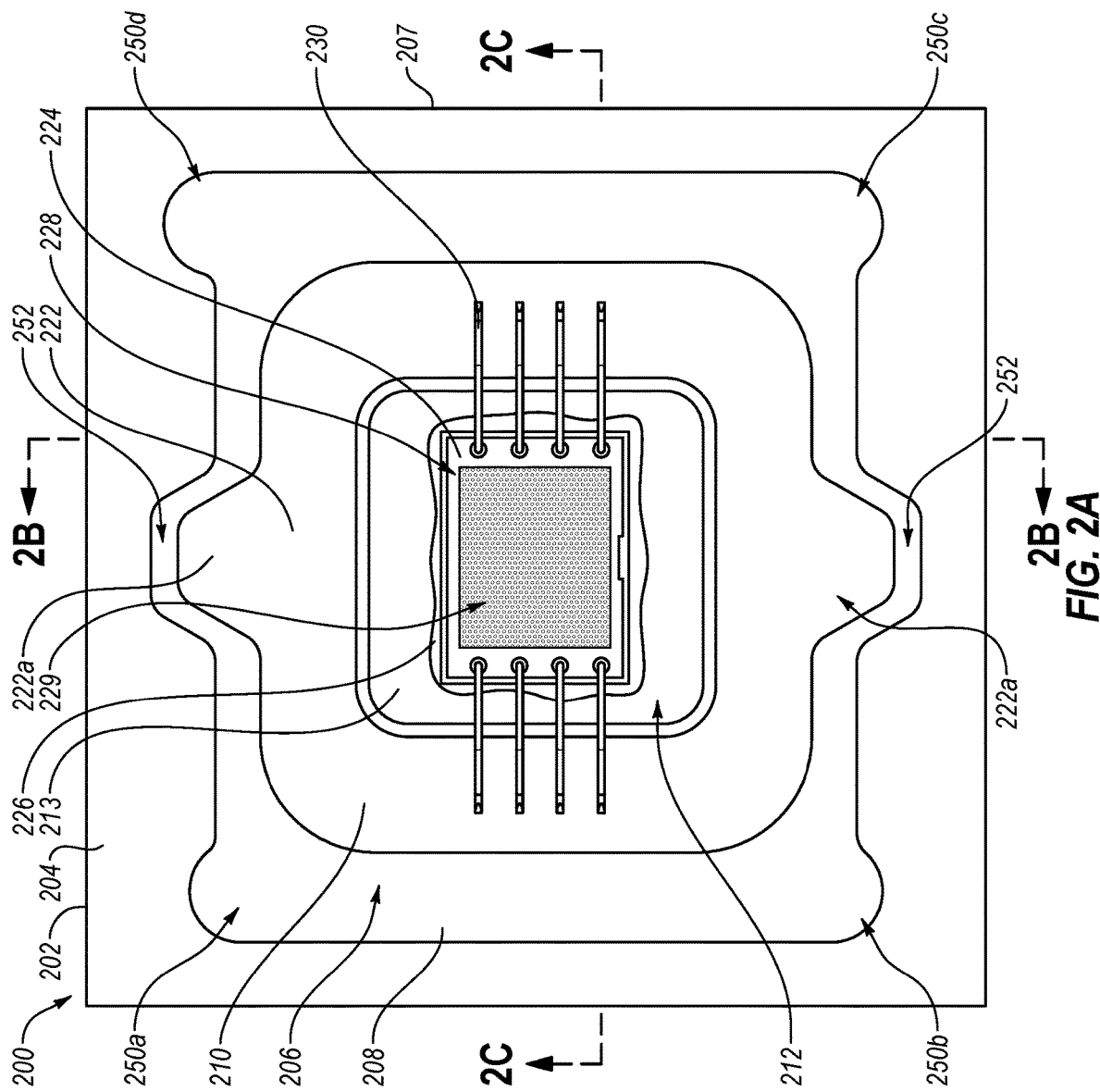

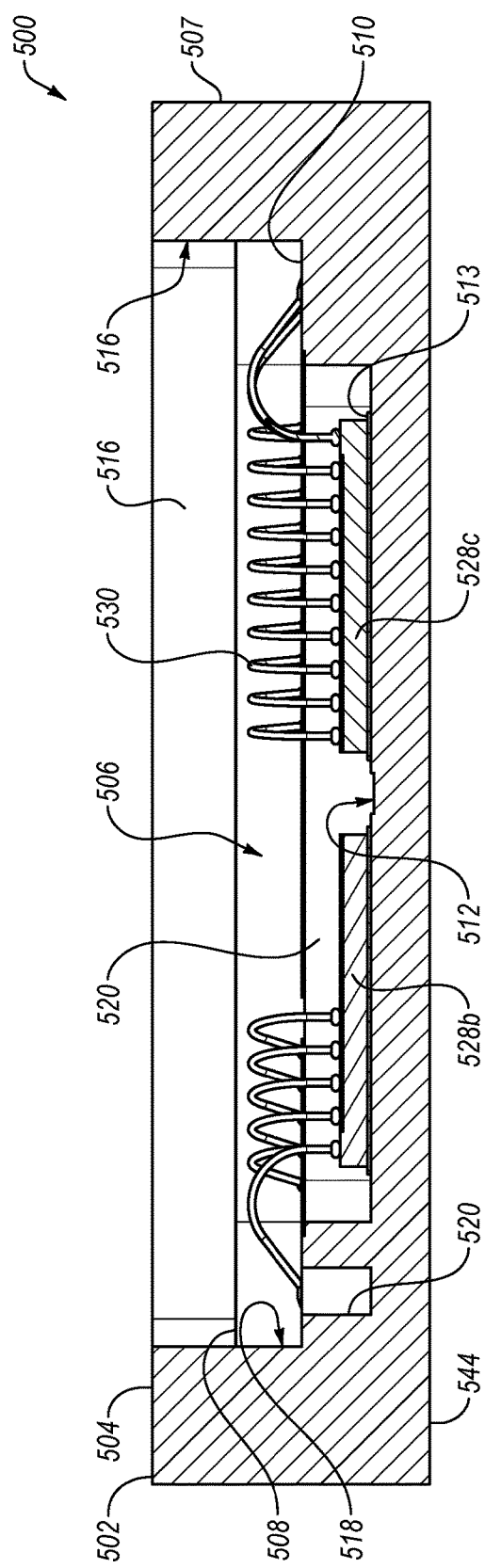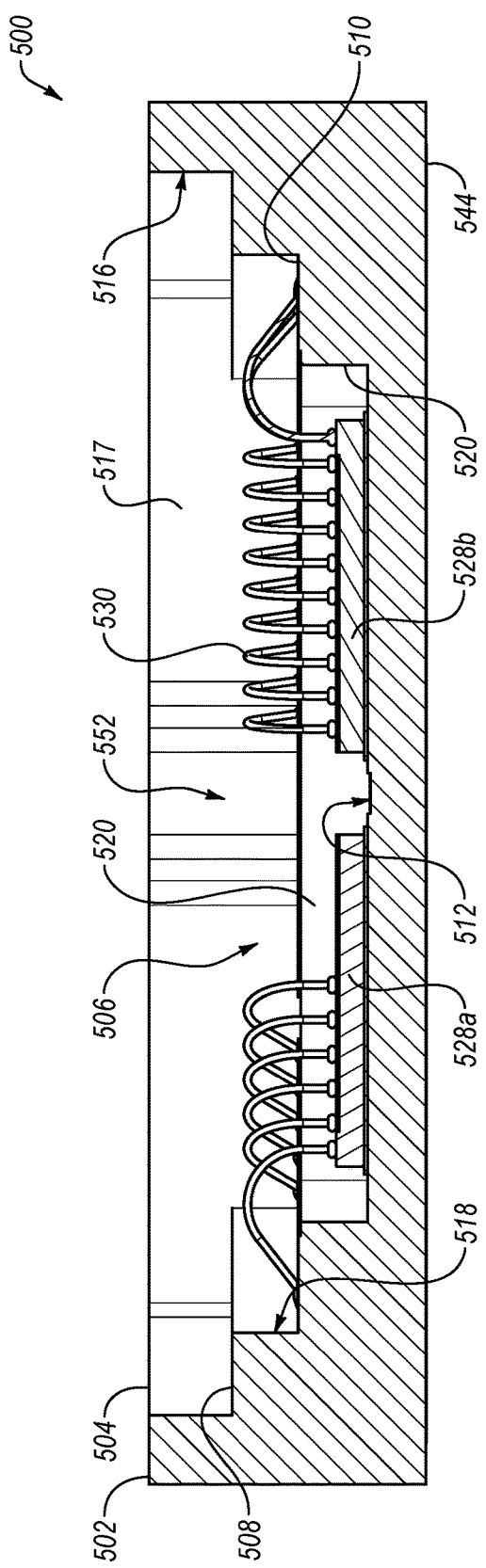

HIGH POWER CAVITY PACKAGE FOR LIGHT EMITTERS

CROSS-REFERENCE TO RELATED APPLICATIONS

This application is a Continuation of U.S. patent application Ser. No. 15/809,733, filed Nov. 10, 2017, titled HIGH POWER CAVITY PACKAGE FOR LIGHT EMITTERS, which is incorporated herein by reference in its entirety.

BACKGROUND

Light emitters, such as lasers can be used in compact optical projectors, which are used in a variety of applications. For example, such projectors may be used to cast light (e.g., structured light or unstructured light) onto an object for purposes of three-dimensional (3D) mapping (also known as depth mapping). Accordingly, light emitters (e.g., lasers) may be included in illumination assemblies to project a pattern of light (e.g., structured or unstructured) onto the object. The terms "optical" and "light" as used herein refer generally to any and all of visible, infrared, and ultraviolet radiation. An image capture assembly captures an image of the light that is projected onto the object, and a processor processes the image so as to reconstruct a 3D map of the object.

Optical projectors may, in some applications, project light through one or more diffractive optical elements (DOEs). For example, a laser device can be used for projecting a pattern that includes two DOEs that are together configured to diffract an input beam so as to at least partially cover a surface. The combination of DOEs reduces the energy in the zero-order (undiffracted) beam. In one embodiment, the first DOE generates a pattern of multiple beams, and the second DOE serves as a pattern generator to form a diffraction pattern on each of the beams.

Additionally, optoelectronic components and optical elements can be included in a single integrated package. An integrated photonics module (IPM) comprises radiation sources in the form of a two-dimensional matrix of optoelectronic elements, which are arranged on a substrate and emit radiation in a direction perpendicular to the substrate. Such an IPM typically comprises multiple, parallel rows of emitters, such as light-emitting diodes (LEDs) or vertical-cavity surface-emitting lasers (VCSELs), forming a grid in the X-Y plane. The radiation from the emitters is directed into an optical module, comprising a suitable patterned element and a projection lens, which projects the resulting pattern onto a scene.

Accordingly, light emitter packages can continue to be developed for applications in 3D scanning, gesture detection, motion sensing, facial recognition, depth sensing, time-of-flight applications, light detection and ranging (LIDAR), biomedical sensing (e.g., eye sensing, fingerprint sensing, or other anatomical feature sensing), or other uses. A CMOS imager, CCD imager, or APD detector or other detectors can detect reflections of the laser light for the functions described herein.

Additionally, light emitters (e.g., lasers) are commonly used in many modern communication components for data transmission. One use that has become more common is the use of lasers in data networks. Light emitters are used in many fiber optic communication systems to transmit digital data on a network. In one exemplary configuration, a light emitter may be modulated by digital data to produce an optical signal, including periods of light and dark output that represents a binary data stream. In actual practice, the light emitter output a high optical output representing binary highs and a lower power optical output representing binary lows. To obtain quick reaction time, the light emitter is constantly on, but varies from a high optical output to a lower optical output.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, an emitter package can include a body having a bottom member, one or more side members extending from the bottom member, and a top surface, wherein the body defines a cavity formed into the top surface and located between the bottom member and one or more side members. The emitter package can also include the cavity having one or more top side walls extending from the top surface to one or more optic shelves, one or more middle side walls extending from the one or more optic shelves to one or more contact shelves, and one or more bottom side walls extending from the one or more contact shelves to a base surface. The emitter package can also include one or more electrical conductive pads on the base surface in the cavity. The emitter package can also include one or more light emitting chips, such as one or more Vertical Cavity Surface Emitting Laser (VCSEL) chips, on the one or more electrical conductive pads, each light emitting chip having one or more of light emitters (e.g., one or more laser emitters). The emitter package can also include one or more shelf contact pads on the one or more contact shelves. The emitter package can also include one or more electrical connector wires connected to and extending between the one or more emitter chips and the one or more shelf contact pads.

The emitter package may be configured into different embodiments. In one aspect, the emitter package can include an optical element on and extending between the one or more optic shelves so as to cover a portion of the cavity. In one aspect, the optical element is an optic on and extending between the one or more optic shelves so as to cover a portion of the cavity below the optic. In one aspect, the body is a unitary member. In one aspect, the emitter package can include: one electrical conductive pad on the base surface in the cavity; one emitter chip on the one electrical conductive pad; and one shelf contact pad on the one or more contact shelves. In one aspect, the emitter package can include: four electrical conductive pads on the base surface in the cavity; one emitter chip on each of the electrical conductive pads; and four shelf contact pads on the one or more contact shelves. In one aspect, the emitter package can include: an anode pad and cathode pad on a bottom surface of the bottom member. In one aspect, the cathode pad is electrically coupled with one of the one or more electrical conductive pads and the anode pad is electrically coupled with one of the one or more shelf contact pads. In one aspect, the one or more electrical conductive pads are each electrically isolated from each other. In one aspect, the one or more shelf contact pads are each electrically isolated from each other. In one aspect, the base surface includes one or more recessed regions around the one or more electrical conductive pads. In one aspect, the emitter package can include: one or more vents formed into the body and extending from the top surface to the one or more bottom side walls, the one or more vents forming a portion of the at least one of the one or more top side walls, and optionally forming a portion of the at least one or more middle side walls. In one aspect, the cavity includes four corners at the top surface, wherein each of the four corners has a rounded relief, wherein one of the rounded reliefs is larger than the other four reliefs. In one aspect, the plurality of emitter chips are electrically connected in series. In one aspect, the plurality of emitters on the one or more emitter chips are configured to emit infrared light. In one aspect, the body is formed of a ceramic or plastic (e.g., thermally conductive plastic). In one aspect, the ceramic is aluminum nitride or alumina (e.g., aluminum oxide). In one aspect, the emitter package can include one or more conductive adhesive layers between and coupling the one or more emitter chips to the one or more electrical conductive pads. In one aspect, the emitter package can include the one or more optic shelves being two optic shelves located on opposite sides of the cavity.

In one embodiment, the emitter package can include an at least one anode pad (or a plurality) and at least one cathode pad (or a plurality) on a bottom surface of the bottom member. A plurality of anode pads and/or cathode pads can allow for specialized control of the emitter chips. In one aspect, each of the one or more cathode pads is electrically coupled with one of the one or more electrical conductive pads; and/or each of the one or more anode pad is electrically coupled with one of the one or more shelf contact pads.

In one embodiment, the cathode pad is electrically connected to a first conductive pad, which is electrically connected through a first emitter chip and a connector wire to a first shelf contact pad, which is electrically connected through one or more first shelf vias to a second conductive pad, which is electrically connected through a second emitter chip and a connector wire to a second shelf contact pad, which is electrically connected through one or more second shelf vias to a third conductive pad, which is electrically connected through a third emitter chip and a connector wire to a third shelf contact pad, which is electrically connected through one or more third shelf vias to a fourth conductive pad, which is electrically connected through a fourth emitter chip and a connector wire to a fourth shelf contact pad, which is electrically connected to the anode pad. However, it should be recognized that this electrical connection sequence can work with one, two, three, or more than four emitter chips with the corresponding number of conductive pads and shelf contact pads. As such, the sequence can be the cathode pad electrically connected to a conductive pad that is electrically connected through an emitter chip and connector wire to a shelf contact pad that is then coupled either (1) through one or more series of conductive pad, emitter chip, connector wire, and shelf contact pad, or (2) to an anode pad.

In one embodiment, a method of emitting a plurality of light beams can include providing the emitter package of one of the embodiments, and emitting out of the cavity from the plurality of light (e.g., laser) emitters of the one or more emitter chips. In one aspect, the method can include operating the plurality of emitters in pulse cycles. In one aspect, the method can include operating the plurality of VCSELs in continuous wave modes. In one aspect, the method can include having the light emitted from the plurality of emitters being infrared light.

In one embodiment, a method of manufacturing an emitter package can include: forming the body having the cavity; placing the one or more electrical conductive pads on the base surface in the cavity; placing the one or more emitter chips on the one or more electrical conductive pads; placing the one or more shelf contact pads on the one or more contact shelves (e.g., ledges); and electrically connecting the one or more emitter chips with the one or more shelf contact pads with one or more electrical connector wires connected to and extending between the one or more emitter chips and the one or more shelf contact pads.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 2A illustrates a top view of an embodiment of an emitter package without an optic.

FIG. 5B illustrates a modified cross-sectional side view of the emitter package of FIG. 5A along line B-B.

FIG. 5C illustrates a modified cross-sectional side view of the emitter package of FIG. 5A along line C-C.

DETAILED DESCRIPTION

Figure 1:
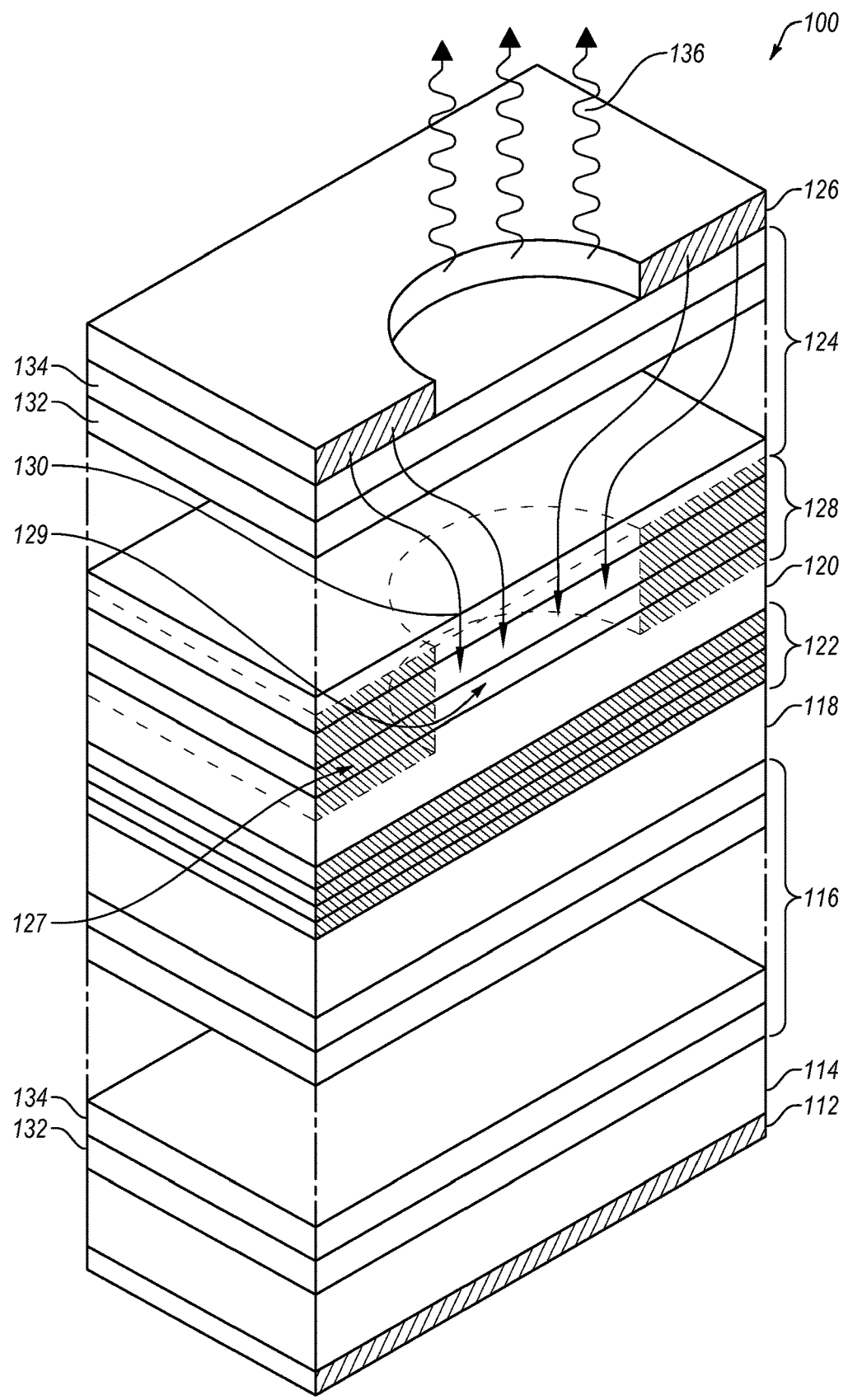
FIG. 1 shows an embodiment of a VCSEL, which is used as an example of a light emitter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting.

Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

One type of emitter that is used in the technology described herein is a Vertical Cavity Surface Emitting Laser (VCSEL). However, it should be recognized that any type of emitter may be used. As such, reference to lasers or specifically to VCSELs may also refer to other light emitters that may be included in the light emitter package described herein. A VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current, the injected minority carriers form a population inversion in the quantum wells that produces optical gain. Optical gain occurs when photons in the active region stimulate electrons to recombine with holes in the conduction band to the valance band, which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

The semiconductor devices of the present invention can be manufactured from any type of semiconductor. Examples of suitable materials include III-V semiconductor materials (e.g., prepared from one or more Group III material (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed))) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. However, the active region can be configured as any known or developed in the art of VCSELs.

Optionally, electrical confining layers can sandwich the active region and provide optical gain efficiency by confining carriers to the active region. The confining layers can have a region of high energy band gap which in many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and can increase the efficiency in the active region. In an exemplary embodiment, the high aluminum region may also include an increase in doping. The confining layer can be doped with a p-type or n-type dopant depending on whether the confinement barrier is on the n-side or p-side of the active region.

FIG. 1 shows a planar, current-guided, VCSEL 100 having periodic layer pairs for top (124) and bottom (116) mirrors. A substrate 114 is formed on a bottom contact 112 and is doped with a first type of impurity (i.e., p-type or n-type dopant). A bottom mirror stack 116 is formed on substrate 114 and an optional bottom confining layer 118 is formed on the bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. An isolation region 128 is formed over the active region 122 or over the optional top confining layer 120. The isolation region includes a lateral region blocking region 127 (e.g., implant, oxidation region, different refractive index, or other) and a central conducting channel core 129. The bottom confining layer 118 and/or top confining layer 120 may be a spacer region between the active region and isolation region. Alternatively, the bottom confining layer 118 and/or top confining layer 120 may be a conducting region. Thus, any spacer region bounding the active region may be a confining region, conducting region, or semiconductor spacer that is not confining or conducting.

An upper top mirror stack 124 is formed over the isolation region 128. A metal layer 126 forms a contact on a portion of stack 124. However, other VCSEL configurations may also be utilized, and various other VCSEL layers or types of layers can be used.

An isolation region 128 restricts the area of the current flow 130 through the active region 122. Isolation region 128 can be formed to include the lateral region blocking region 127 and a central conducting channel core 129. The isolation region 128 can include a single layer blocking region 127 or multiple layers of blocking layers, and/or a single layer central conducting channel core 129 or multiple layers of central conducting channel core layers.

Mirror stacks 116 (bottom) and 124 (top) can be distributed Bragg reflector (DBR) stacks, and include periodic layers (e.g., 132 and 134, but may be switched from what is shown). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124. Those skilled in the art will recognize that other configurations of contacts can be used to generate a voltage across active region 122 and generate light 136.

Active region 122 can be formed from one or more quantum wells that are separated by quantum well barriers. The confining layers 118 and 120 may optionally include high aluminum content regions. The high aluminum content regions provide good carrier confinement in active region 122. Confining region 120 can include a ramp region that is positioned between active region 122 and high aluminum content region. As discussed below, the combination of high aluminum content region and the ramp region provide an injection structure with good carrier confinement and good electron injection. Depending on the design of the VCSEL device and the thickness of high aluminum content regions, the confining regions 118 and 120 can optionally include spacer layers, where thickness of spacer layers can be dependent upon the kind of VCSEL device being fabricated. In a vertical cavity resonant device such as a VCSEL, the spacer layers provide resonant spacing between mirrors and provide that the quantum wells of the active region are centered on a peak of the optical field if desired. The confining layers 118 and 120 and active region 122 can be formed from one or more types of semiconductor materials, such as GaAs, AlAs, InP, AlGaAs, InGaAs, InAlAs, InGaP, AlGaAsP, AlGaInP, InGaAsP, InAlGaAs, SiGe, or the like.

In one example, the lower electrical confining layer is AlInP. In another example, the upper electrical confining layer can be AlInGaP.

In one embodiment, a single substrate can include a plurality of VCSEL emitters or other light emitters, which can be formed into an array. As such, the VCSEL of FIG. 1 may be included in an array format with the plurality of the individual emitters being VCSEL on the same emitter chip (e.g., VCSEL chip).

The heterojunction conductive channel configuration can provide improved reliability, electro-optical bandwidth, and link distances by allowing implementation of small aperture (e.g., 2-6 µm) VCSEL devices. In high power VCSELs, the heterojunction conductive channel configuration allows higher maximum power per VCSEL, and more emitters per unit area in dense arrays.

This heterojunction conductive channel configuration enables more efficient mass production of guided mode VCSELs by allowing use of one or more MOCVD (metal-organic chemical vapor deposition) crystal growth steps in fabrication. As such, the process can omit lateral steam oxidization, or formation of any oxide aperture.

In one embodiment, the VCSEL can be an IR VCSEL. In one aspect, the VCSEL can be a 940 nm multimode VCSEL. The VCSEL can include an oxidized region, such as the blocking region. The VCSEL can include a 10 micron aperture for each emitter, with a 30 micron pitch between optical apertures.

Now with the present technology, very small apertures can be formed in a blocking layer to form one or more emitter devices with improved reliability. The very small aperture emitter devices can now be very close to each other. For example, the individual conductive channel cores can have diameters (or other cross-dimensions) of from 1 micron to 10 microns, from 1.5 microns to 5 microns, from 2 microns to 4 microns, or about 2.5-3 microns. The individual conductive channel cores can be separated by distances (e.g., minimum distance apart) from 1 micron to 10 microns, from 1.5 microns to 5 microns, from 2 microns to 4 microns, or about 2.5-3 microns. This can include 1, 2, 3, 4, 5, 6, 7, 8, 9, 10, or more emitters on a common chip, where one or more (e.g., 4 or 5) can be coupled into a common optical fiber.

Generally, the present advancement in light emitter technology relates to an emitter package having a single emitter chip or a plurality of emitter chips. The emitter packages can be configured to provide a cavity that can retain the single emitter chip or plurality of emitter chips, where the emitter chip(s) can be arranged to provide higher power. The emitter package can include a cavity having the plurality of emitter chips in series, which can allow for multiple emitter chips in the emitter package without substantially increasing the current to drive the emitter chips. Some high power emitter packages are designed for a single emitter chip, and thereby have a limited amount of drive current available. Also, now a device having the emitter package with the cavity having one emitter chip or a plurality of emitter chips can utilize extra available voltage to drive multiple emitter chips in series. This allows for an increase in the number of emitter active regions and may consume less current by using the extra available voltage. The power to current ratio may be increased with the emitter package configurations having the plurality of emitter chips, such as described herein. However, when increased current is available, the emitter package can be configured to use the additional current for high power applications.

However, an emitter package for a single emitter chip design, such as described herein, is monolithic and more robust than prior designs. In one aspect, the single emitter chip design may include one emitter region or a plurality of emitter regions, which can operate similarly to single VCSEL or a plurality of individual VCSELs (e.g., see U.S. patent Ser. Nos. 15/671,433 and 15/718,342, which are each incorporated herein by specific reference in its entirety). Such an emitter chip may also be used in the emitter packages configured for multiple emitter chips.

In one aspect, the technology omits or is devoid of a flat ceramic base with boxed sides formed on the base to make a cavity that has an optic on top. While the ceramic base may have high thermal conductivity to diffuse heat, the boxed sides are often epoxied to the base and not thermally conductive. As such, the package of the present technology is monolithic with an optic coupled thereto. By being monolithic, the bottoms and sides can be thermally conductive and used to dissipate heat without being subjected to epoxy failure. The package is designed to have improved performance and longevity due to the monolithic design.

The emitter package can be used for any type of light illumination or data transmission for any purpose. In one aspect, the emitter package can be used as an IR illuminator that uses the one or more emitter chips to emit IR light (e.g., laser). The one or more emitter chips can be operated with short pulses, such as 1-2 nanosecond pulses or pulse cycles, for the functionalities described herein. Additionally, the one or more emitter chips can be used in continuous wave (CW) modes for various functionalities, which may be modulated or structured post-optic.

In one embodiment, the body of the emitter package can be formed of a ceramic, such as aluminum nitride or alumina (e.g., aluminum oxide). The use of a ceramic (e.g., aluminum nitride) allows for improved heat dissipation from the emitter package. This allows the emitter package to be used in long duty cycles or a CW type application.

In one embodiment, the emitter package can include only a single emitter chip. The packages can include a body having a cavity that is adapted as described herein, where the cavity can be a single cavity formed into a monolithic structure having a unitary body. The package can include an optic over the cavity to direct (e.g., or diffuse, channel, pattern, etc.) the emitter light emitted from the emitter chip. The emitter chip can include tens to hundreds, and possibly thousands of individual emitters. In one example, the monolithic emitter package can be 3.5 mm×3.5 mm, and can include a single 1 mm×0.75 mm emitter chip having a plurality of emitters. However, it should be recognized that the dimensions may vary. In one aspect, the emitter package includes the optic in order to create a singular cohesive beam and/or pattern, which singular cohesive beam and/or pattern can be irrespective of the number of emitters and light emitter chips in the emitter package.

Figure 2B:
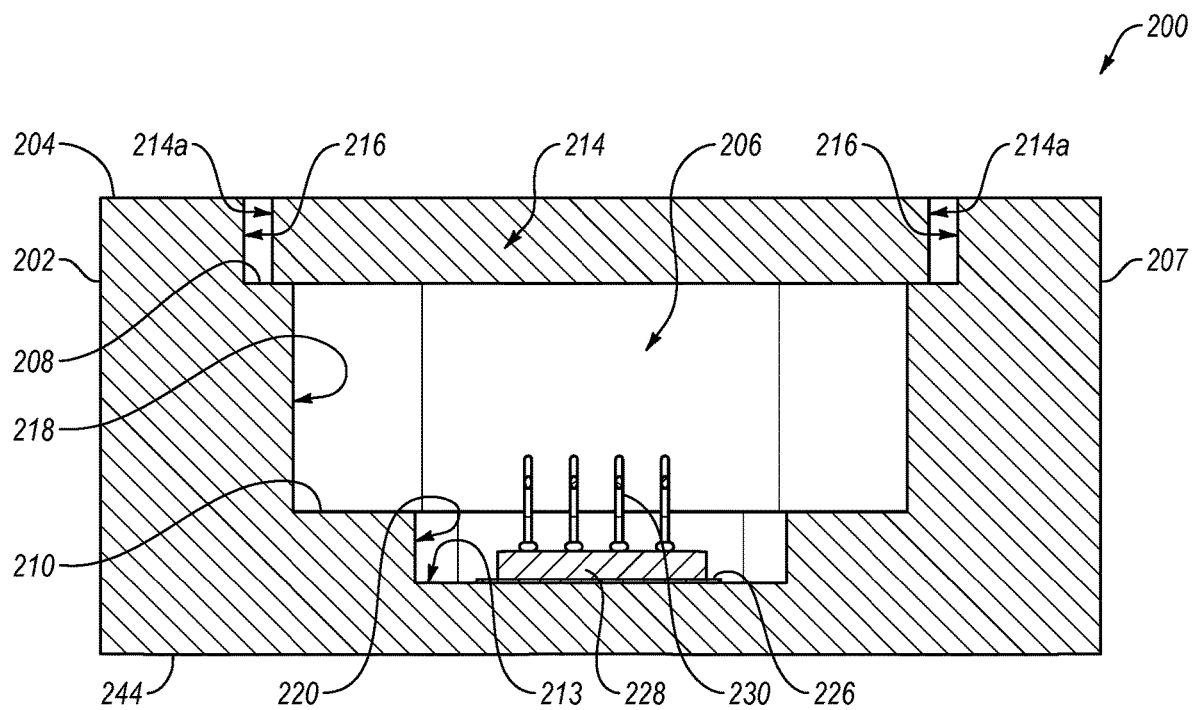
FIG. 2B illustrates a modified cross-sectional side view of the emitter package of FIG. 2A along line B-B with an optic.
Figure 2C:
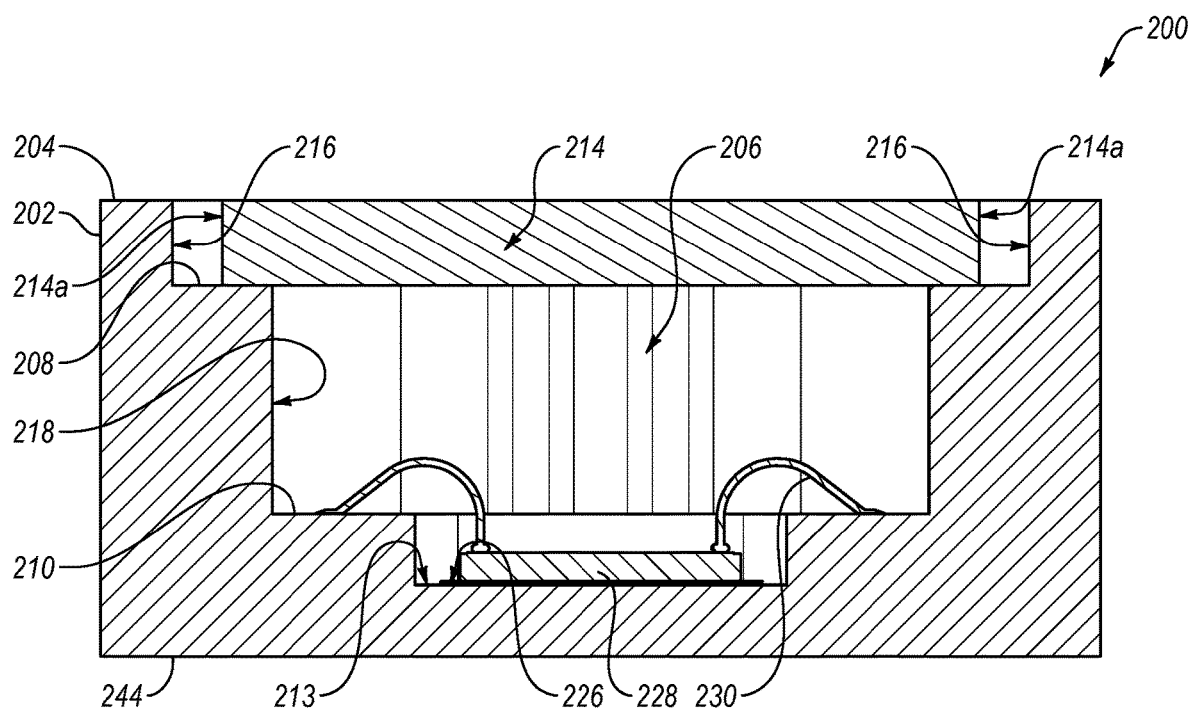
FIG. 2C illustrates a modified cross-sectional side view of the emitter package of FIG. 2A along line C-C with an optic.
Figure 2D:
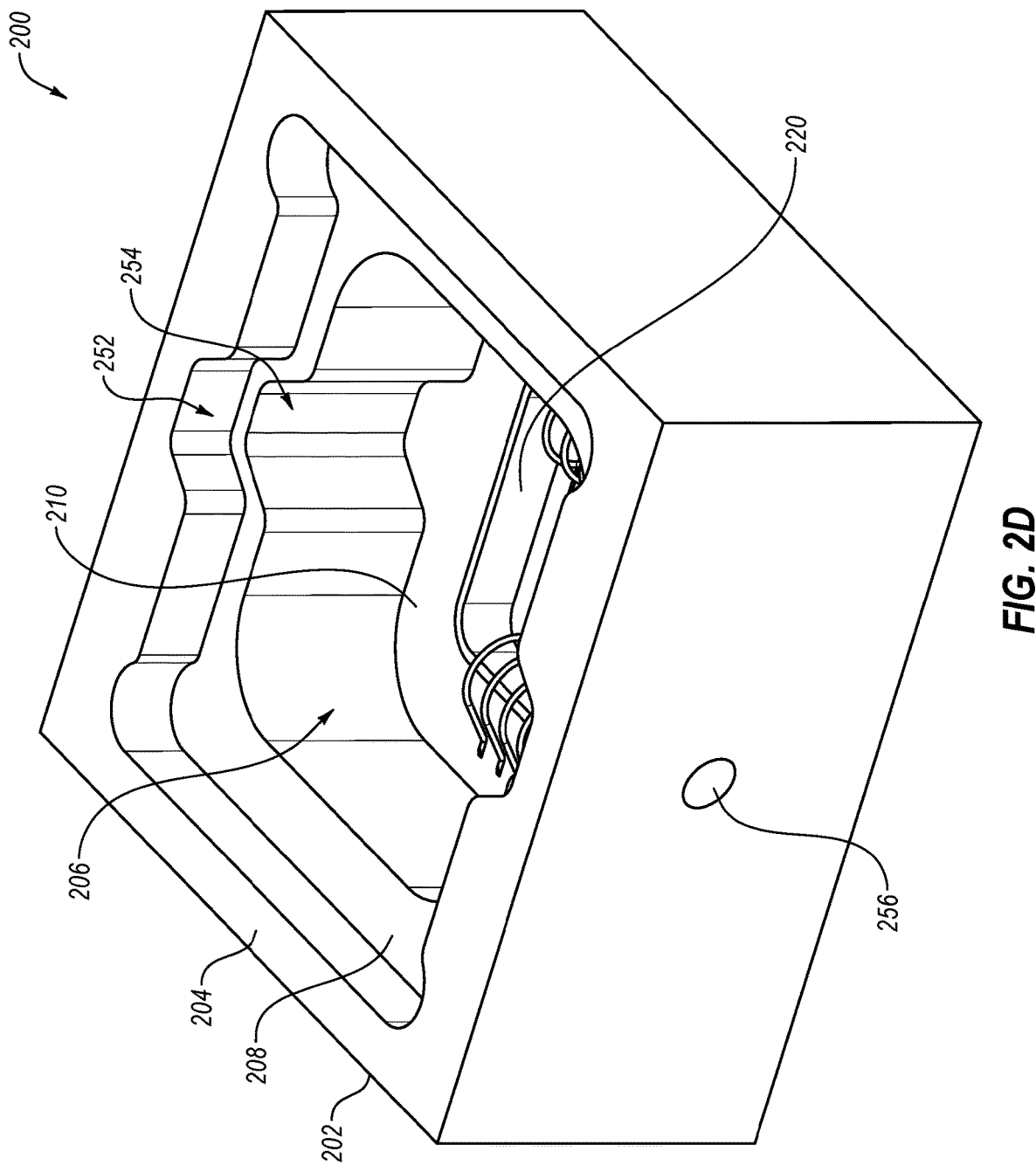
FIG. 2D illustrates a perspective view of the emitter package of FIG. 2A without an optic.
Figure 2E:
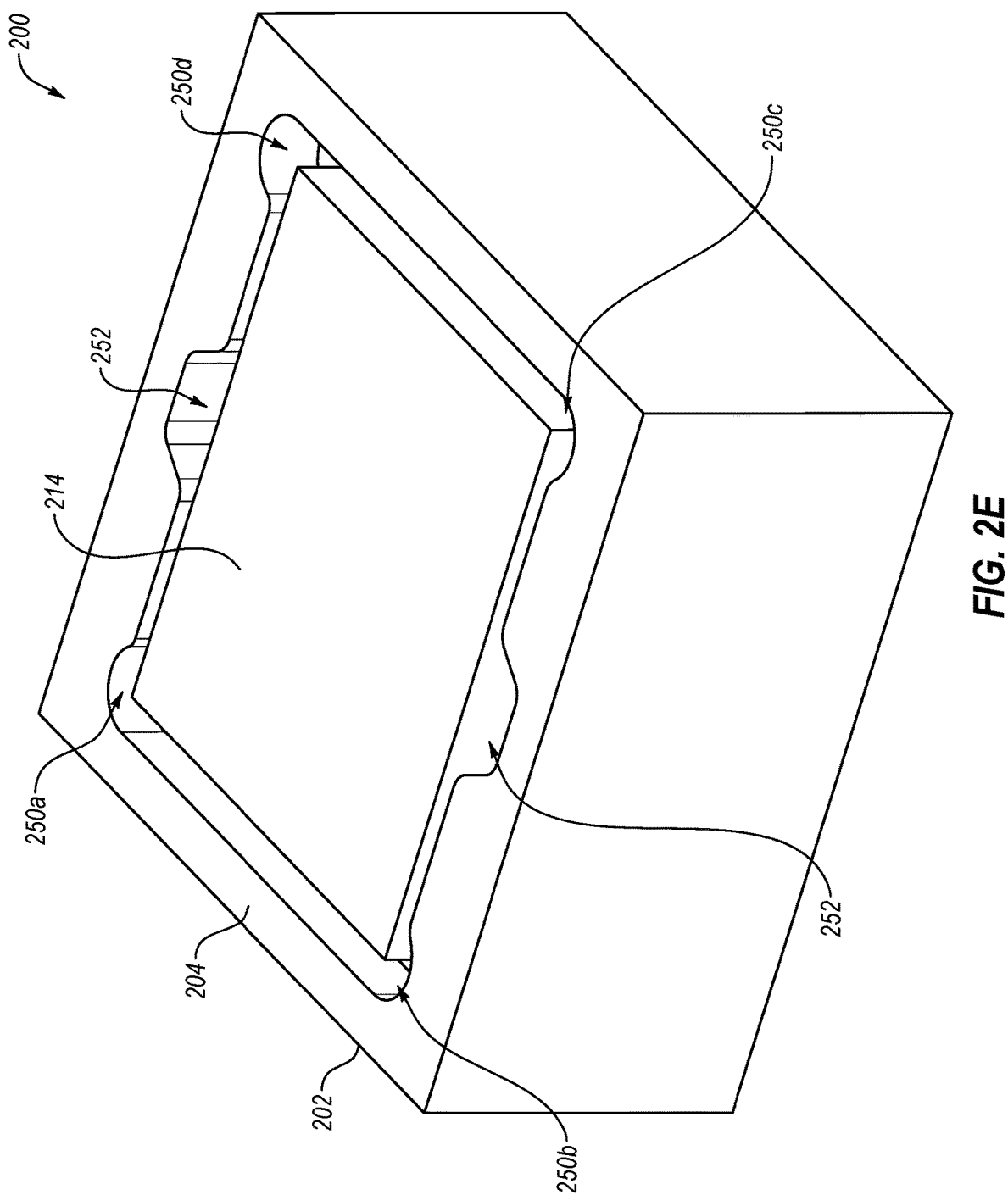
FIG. 2E illustrates a perspective view of the emitter package of FIG. 2A having an optic.
Figure 2F:
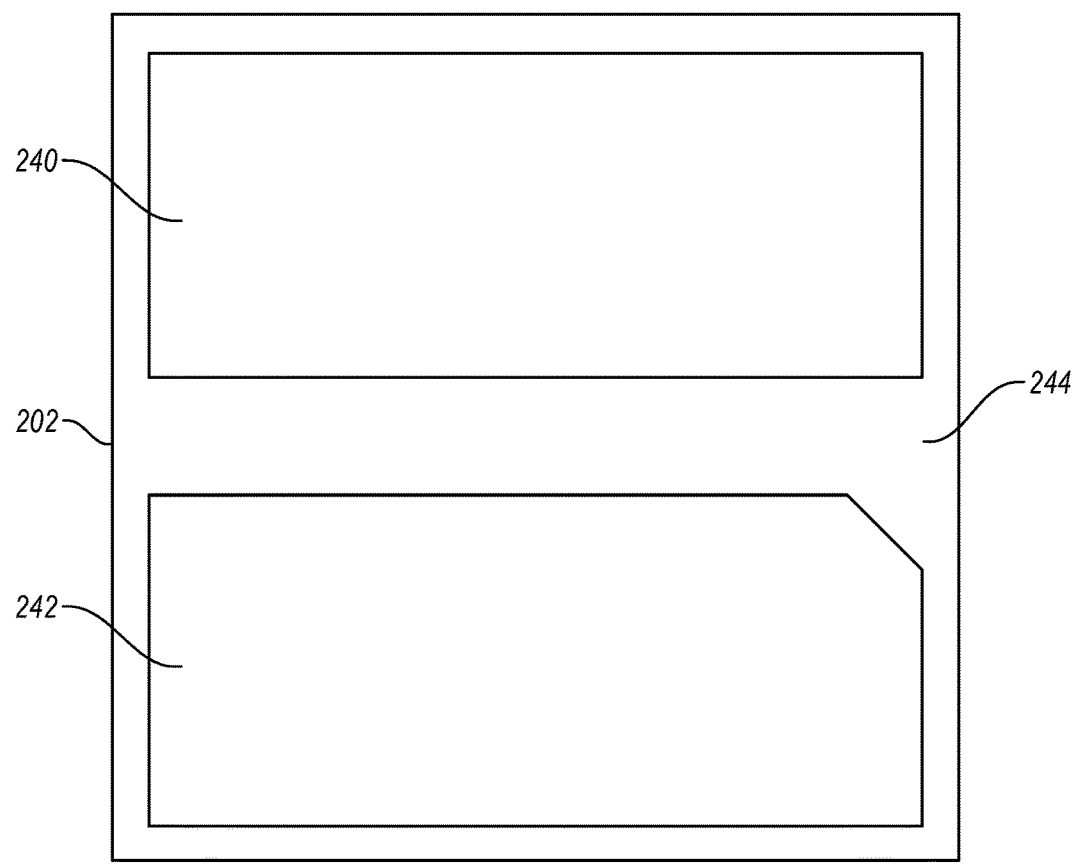
FIG. 2F illustrates a bottom of the emitter package of FIG. 2A, and may also be the bottom of the embodiment of the laser package of FIGS. 4 and 5A.

FIGS. 2A-2F illustrate an emitter package 200 in accordance with the embodiments described herein. FIG. 2A illustrates a top view of the emitter package 200. FIG. 2B illustrates a modified cross-sectional side view along line B-B and shows the features of the unitary body 202. FIG. 2C illustrates a modified cross-sectional side view along line C-C and shows features of the unitary body 202. FIG. 2D illustrates a perspective view of the emitter package. FIG. 2E illustrates a perspective view of the emitter package having an optic. FIG. 2F illustrates a bottom of the emitter package 200.

The emitter package 200 includes a unitary body 202 that is monolithic and formed from a single piece. The body 202 includes a top surface 204 having a cavity 206 formed therein, and with external side walls 207 and a bottom surface 244. The cavity 206 includes an optic shelf 208, a contact shelf 210, and a base surface 212. The body 202 has a top side wall 216 extending between the top surface 204 and optic shelf 208, a middle side wall 218 extending between the optic shelf 208 and contact shelf 210, and a bottom side wall 220 extending between the contact shelf 210 and the base surface 212. The optic shelf 208 is configured to hold an optic 214 as shown in FIG. 2E. The contact shelf 210 is configured to hold at least one electrical shelf contact pad 222, which may include a non-metalized or exposed portion of the contact shelf 210 such as shown in the figures as a perimeter around the electric shelf contact pad 222. The base surface 212 is shown to have a conductive pad 213, which conductive pad 213 is a cathode. As shown, the conductive pad 213 covers the entirety of the base surface, but it may only cover a majority or a portion of the base surface 212; however, the conductive pad 213 may be at any location and of any suitable size on the base surface 212. The conductive pad 213 is shown to have an adhesive layer 226 adhered to the emitter chip 228 having an emitter array 229, where the adhesive layer 226 is electrically isolated from the emitter contact 224. The adhesive layer 226 is a conductive adhesive that allows for an electrical connection between the conductive pad 213 to the emitter chip 228 (see FIG. 1). The adhesive layer 226 can be a conductive adhesive, such as a conductive epoxy. The emitter array 229 can have 500 or more individual emitters; however, any reasonable number may be used. In one example, there may be a gap between contact shelf 210 and bottom side wall 220 of exposed body 202, which is without a conducting material. In an example the cross-sectional profile (e.g., dimensions) of the base surface 212 and the conductive pad 213 may be the same. In one example, there is no gap between the conductive pad 213 and the bottom side wall 220.

Electrical connecting wires 230 extend from the emitter contact 224 of the emitter chip 228 to the electrical shelf contact pad 222 on the contact shelf 210. As shown, there are four connecting wires 230 on opposite sides for a total of eight connecting wires 230; however, any suitable number can be used based on the number of individual emitters in the emitter array 229. The electrical shelf contact pad 222 is the anode.

While not shown, the contact shelf 210 has vias or other electrical conduits that electrically couple the shelf contact pad 222 to the base anode 240 on the bottom surface 244 as shown in FIG. 2F. FIG. 2F also shows the base cathode 242 on the bottom surface 244 that is electrically coupled to the conductive pad 213, such as through vias or other electrical conduits (not shown). Additionally, the shelf contact pad 222 and conductive pad 213 are electrically isolated from each other, such as by the ceramic material of the bottom side wall 220.

The top surface 204 and top side walls 216 are shown to form corner reliefs 250a,b,c,d, which are notches taken out of the corners to form the rounded portions. These corner reliefs 250a,b,c,d allow for the optic 214 to be placed properly and to accommodate the corner of the optic 214. It is noted that relief 250d is larger, which can be used to denote the orientation of the emitter package 200. It should be recognized that any relief 250a,b,c,d may be larger or a different shape to denote orientation. The optic edges 214a are shown to be spaced from the top side walls 216.

Additionally, the top surface 204 and top side walls 216 are shown to form vents 252, which are notches in the top surface 204 and top side walls 216, and where two vents 252 are shown on opposite sides. Also, the optic shelf 208 and middle side walls 218 are shown to form vents 254, which are notches in the optic shelf 208 and middle side walls 218, and where two vents 254 are shown on opposite sides, and which correspond with the vents 252. This allows for ventilation from the emitter chip 228. It is noted that the optic 214 does not cover the vents 252, 254, so that there is an air gap to allow for circulation from outside of the emitter package 200 to the emitter chip 228. The electrical shelf contact pad 222 is shown to also have wings 222a that extend into the notches that form the vents 254.

In one embodiment, the body 202 can be devoid of the vents 252 and/or vents 254, which may be optional. Alternatively, the body 202 may include one, two (shown), three, four, or more vents (252 and/or 254).

Additionally, FIG. 2D shows a side vent hole 256, which can extend partially or fully into the cavity 206. This vent hole 256 is optional.

In one embodiment, the base surface 212 can include a lower surface or recess that is lower than the portion holding the emitter chip 228. In reference to the figures, a region of the base surface 212 may be lower than the region holding the conductive pad 213. Such a lower surface or recess can enhance electrical isolation between the conductive pad 213 and shelf contact pad 222. On the other hand, the base surface may have a raised surface or mesa that has the conductive pad 213.

Figure 3:
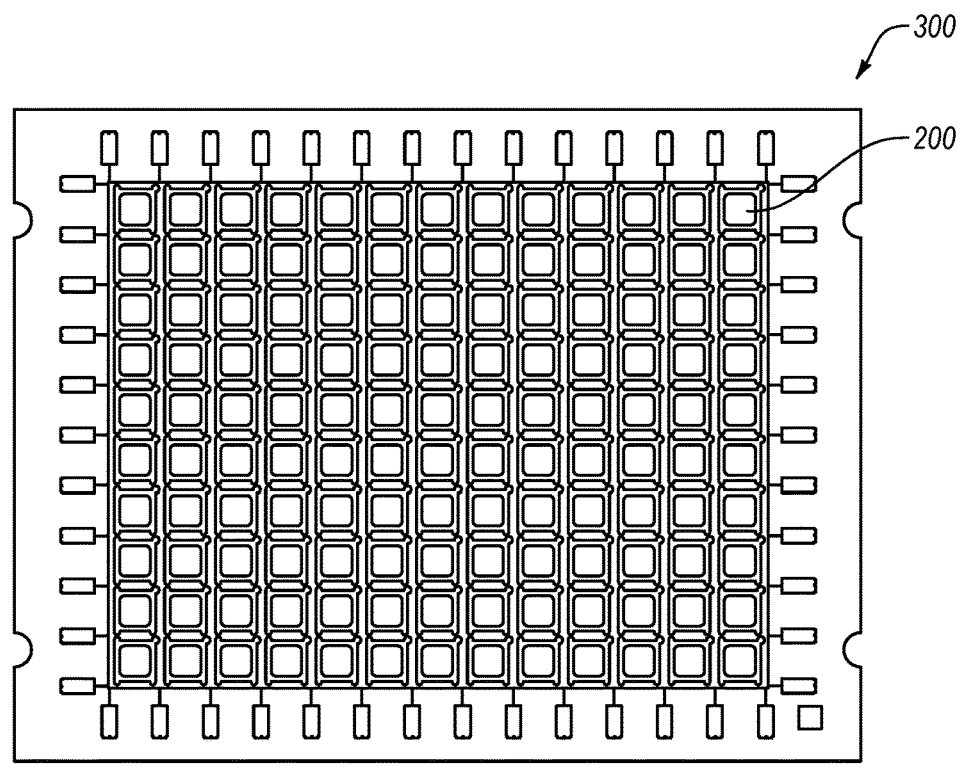
FIG. 3 shows an embodiment of an emitter package array having a plurality of laser packages in an array as manufactured.

FIG. 3 shows an emitter package array 300 having a plurality of emitter packages 200 in an array pattern as manufactured. During manufacturing, the body 202 of the emitter package 200 is formed as a unitary piece, and the anode 240 and cathode 242 are formed on the bottom surface 244, and the conductive pad 213 and electrical shelf contact pad 222 are put into place as shown (e.g., pad plated on the ceramic base, adhered with adhesive, etc.). In one example, the body 202 can be formed by any method, such as layering with ceramic layers and firing to solidify into a unitary body. In another example, a solid member may be selectively etched or have portions removed to make the shape. The emitter package array 300 can be prepared as described or otherwise known. A single emitter chip 228 is attached to the conductive pad 213 via the adhesive 226. The connecting wires 230 are then connected to the VCSEL chip 228 and electrical shelf contact pad 222. Then, the optic 214 is installed onto the optic shelf 208, which may be secured with an adhesive. The laser package 200 is then singulated or otherwise separated from the package array 300. The VCSEL chip 228 can then be tested for functionality and for optical safety, and functional VCSEL chips 228 in the laser package 200 are then packaged in array format for storage and shipping. In one aspect, the packaging can be done using tape and reel.

In an example, the emitter chip can be 1 mm×0.75 mm×0.1 mm height. The emitter array may include over 500 emitters (e.g., 537) each with a 10 micron aperture and 30 micron spacing center to center.

In one embodiment, the optic 214 can be substituted or coupled with various types of optical elements that allow for the laser light (or other light) to be emitted therethrough. The optic may be patterned or replaced with a patterned optical element. The optic should be understood to be an optical element or any optical component, which may be glass, polymer, or other optical transmissive material. Examples can be clear windows, patterned windows, colored windows, windows having colored patterns, diffractive optical elements, lens, diffuser, absorption modulator, or other, as well as multiple members of each and combinations thereof. The optic can be any suitable shape, such as square or rectangle, or it can have rounded edges that match the reliefs. For example, the optic may be a 110×85 degree diffuser. In one example, the optic may also be an encapsulant (e.g., transparent filler) that encapsulates the emitter chip 228 and fills the cavity 206 of the emitter package 200. In one aspect, the emitter package can include an encapsulating material encapsulating at least the one or more light emitter chips, which may cover the base surface and may or may not extend to the optic shelf 208.

The body 202 can be prepared of any material, from plastics to ceramics. However, ceramic bodies may be better at dissipating heat. Aluminum nitride is an example of a material for the body 202, as described above.

Figure 4:
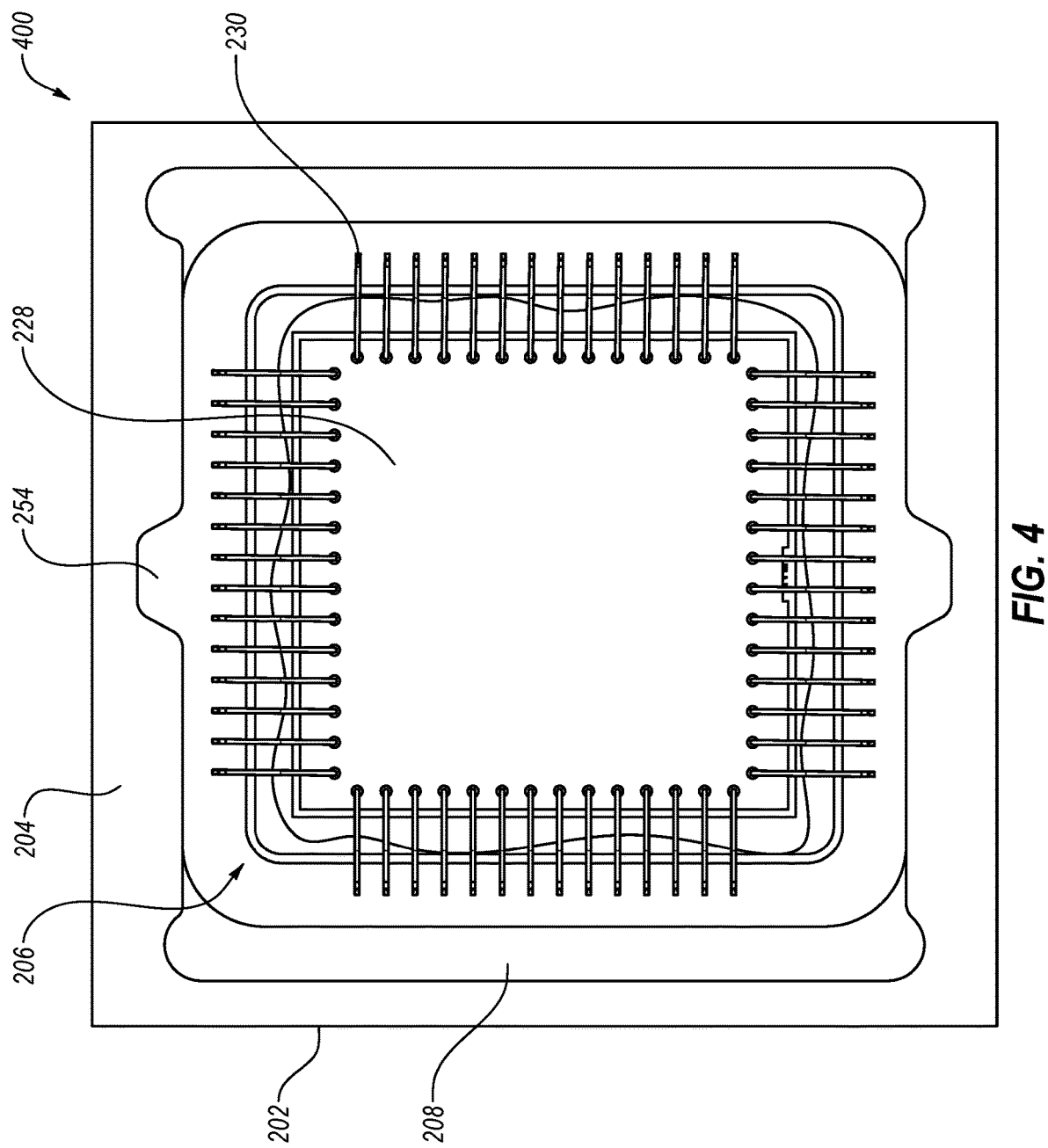
FIG. 4 shows an embodiment of an emitter package.

FIG. 4 shows another embodiment of an emitter package 400, which is configured similarly to the emitter package 200 of FIGS. 2A-2F. However, the emitter chip 228 is substantially larger with more individual emitters, which results in more connecting wires 230. Also, the body 202 has an optic shelf 208 that does not go all the way around the cavity 206 as shown in the other figures. As such, there is no optic shelf 208 where the vent 252 is located. Here, there are two optic shelfs 208 on opposite sides, which can hold the optic or other optical element. Also, FIG. 2F may also represent the bottom view of the emitter package 400.

In one embodiment, the emitter package can include a plurality of emitters. In one example, the monolithic emitter package can be 5 mm×5 mm, and can include four 1.1 mm×1.1 mm emitter chips, each emitter chip having one emitter or a plurality of emitters. However, based on the disclosure herein, the plurality of emitter chips may be two emitter chips side by side, three emitter chips in a row, five emitter chips in a pattern, or any other number of emitter chips. However, it should be recognized that the outer dimensions of the emitter package can be varied independently of the number of emitter chips in the cavity, which allows the package size to be tailored for a given use or a limited amount of space in which it is used. It should also be recognized that each emitter chip includes a base conductive pad on the package base and each emitter chip is electrically coupled to a shelf contact pad.

Figure 5A:
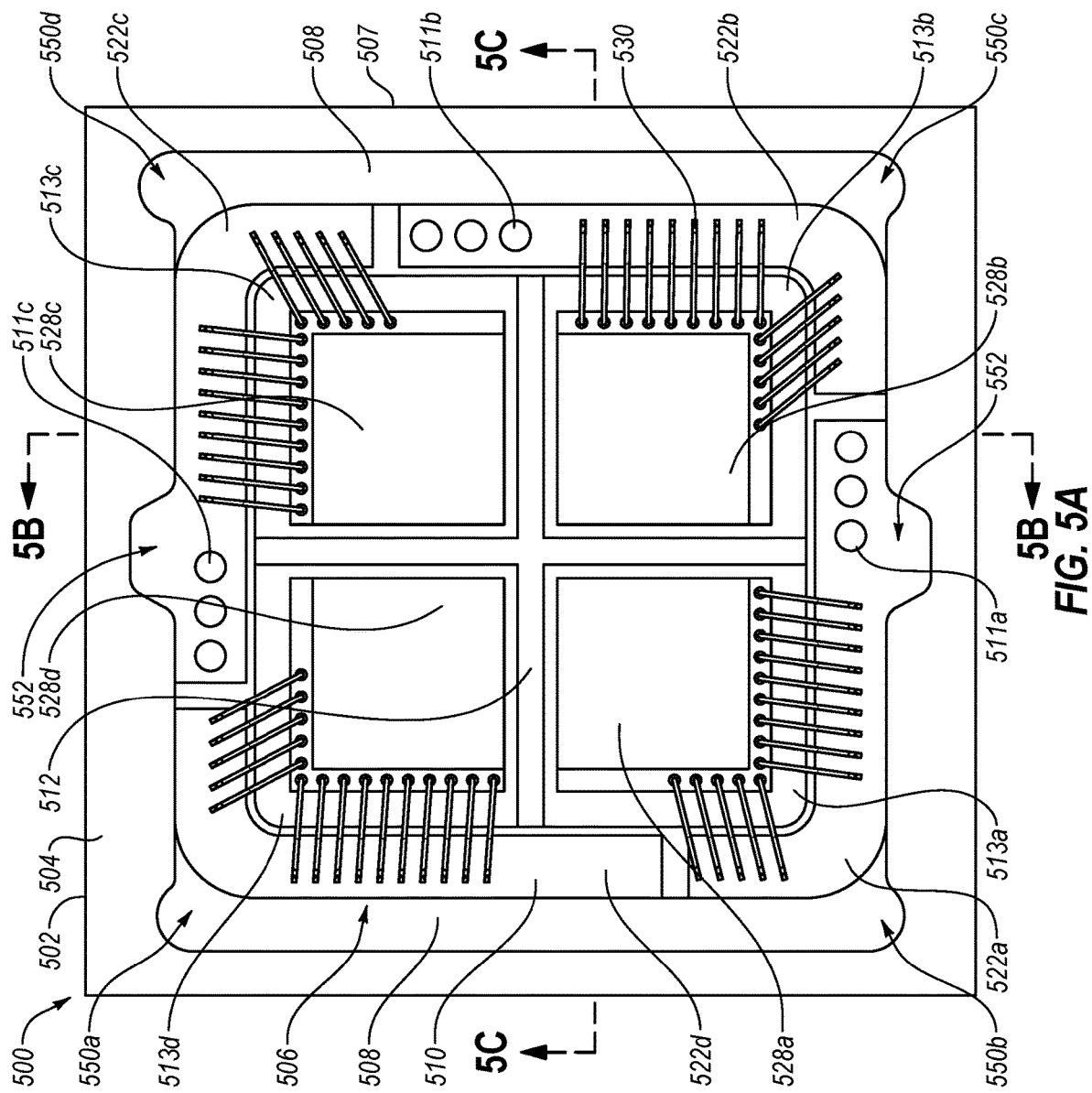
FIG. 5A illustrates a top view of an embodiment of an emitter package having four emitter chips.
Figure 5D:
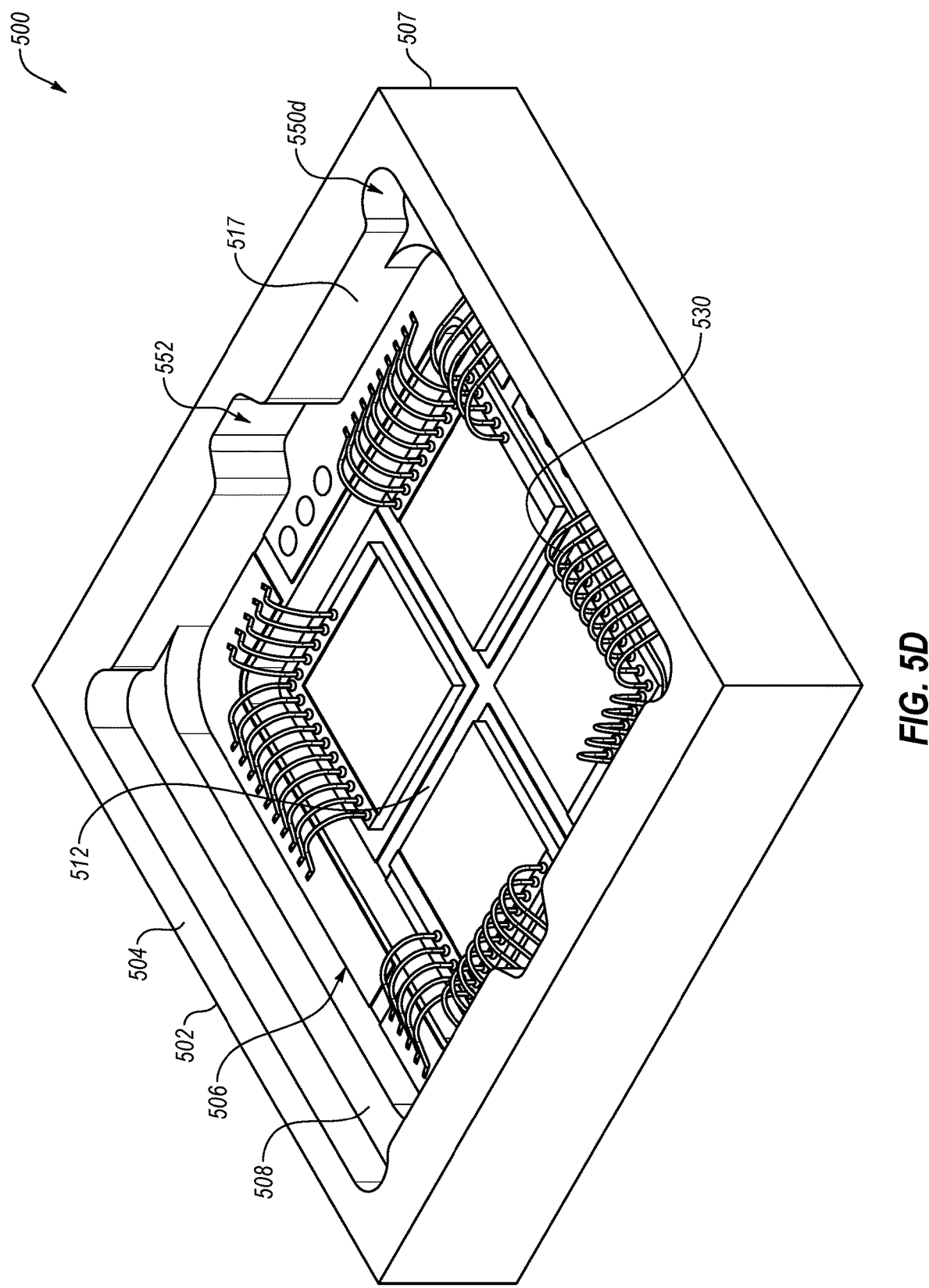
FIG. 5D illustrates a perspective view of the emitter package of FIG. 5A.

FIGS. 5A-5E illustrate an emitter package 500 in accordance with the embodiments described herein. FIG. 5A illustrates a top view of the emitter package 500. FIG. 5B illustrates a modified cross-sectional side view along line B-B and shows the features of the unitary body 502. FIG. 5C illustrates a modified cross-sectional side view along line C-C and shows features of the unitary body 502. FIG. 5D illustrates a perspective view of the emitter package.

FIG. 5A shows an emitter package 500 configured similarly as the other emitter packages described herein except that it is configured for four separate emitter chips 528a,b,c,d. The emitter package 500 includes a unitary body 502 that is monolithic and formed from a single piece. The body 502 includes a top surface 504 having a cavity 506 formed therein, and with external side walls 507 and a bottom surface 544. The cavity 506 includes two optic shelves 508 on opposite sides (however, there may be a single optic shelf or a plurality of optic shelves), a contact shelf 510, and a base surface 512, where the base surface 512 can include a raised portion(s) as shown or a recess for electrical isolation between emitter chips 528a,b,c,d. In one aspect, the base surface includes the raise portions between emitter chips 528a,b,c,d to inhibit electrical shorting from the conductive adhesive (not shown). Where there are optic shelves 508, the body 502 has a top side wall 516 extending between the top surface 504 and optic shelf 508, a middle side wall 518 extending between the optic shelf 508 and contact shelf 510, and a bottom side wall 520 extending between the contact shelf 510 and the base surface 512. Where there are no optic shelves 508, the body 502 has a side wall 517 extending between the top surface 504 and contact shelf 510, and a bottom side wall 520 extending between the contact shelf 510 and the base surface 512. The optic shelves 508 are configured to hold an optic (e.g., same as shown in FIG. 2E). The contact shelf 510 is configured to hold at least one electrical shelf contact pad, shown here are four electrical shelf contact pads 522a,b,c,d, one electrical shelf contact pad for each VCSEL chip 528a,b,c,d. The base surface 512 is shown to have four conductive pads 513a,b,c,d (e.g., any conductive pad being 513), which conductive pads 513a,b,c,d are each a cathode. As shown, the conductive pads 513a,b,c,d together cover a majority of the base surface 512; however, the conductive pads 513a,b,c,d may be at any location and of any suitable size. As shown, the base surface 512 is exposed in gaps (e.g., raised surfaces forming the gaps, or recesses forming the gaps) between the conductive pads 513a,b,c,d such that they are electrically isolated from each other. The conductive pads 513a,b,c,d can be adhered by an adhesive layer (not shown) to an emitter contact (not shown) of an emitter chip 528a,b,c,d having a single emitter or an emitter array. The adhesive layer is a conductive adhesive that allows for an electrical connection between the conductive pads 513a,b,c,d to the emitter chips 528a,b,c,d. The adhesive layer can be a conductive adhesive, such as a conductive epoxy. The emitter array can have 500 or more individual emitters; however, any reasonable number may be used.

Electrical connecting wires 530 extend from the emitter contact of the emitter chip 528a,b,c,d to the electrical shelf contact pads 522a,b,c,d on the contact shelf 510. As shown, there are a plurality of connecting wires 530 for each emitter chip 528a,b,c,d; however, any suitable number can be used based on the number of individual emitters in each emitter array. The electrical shelf contact pads 522a,b,c,d are each an anode, and are connected in series through the emitter chips as described herein.

Figure 5E:
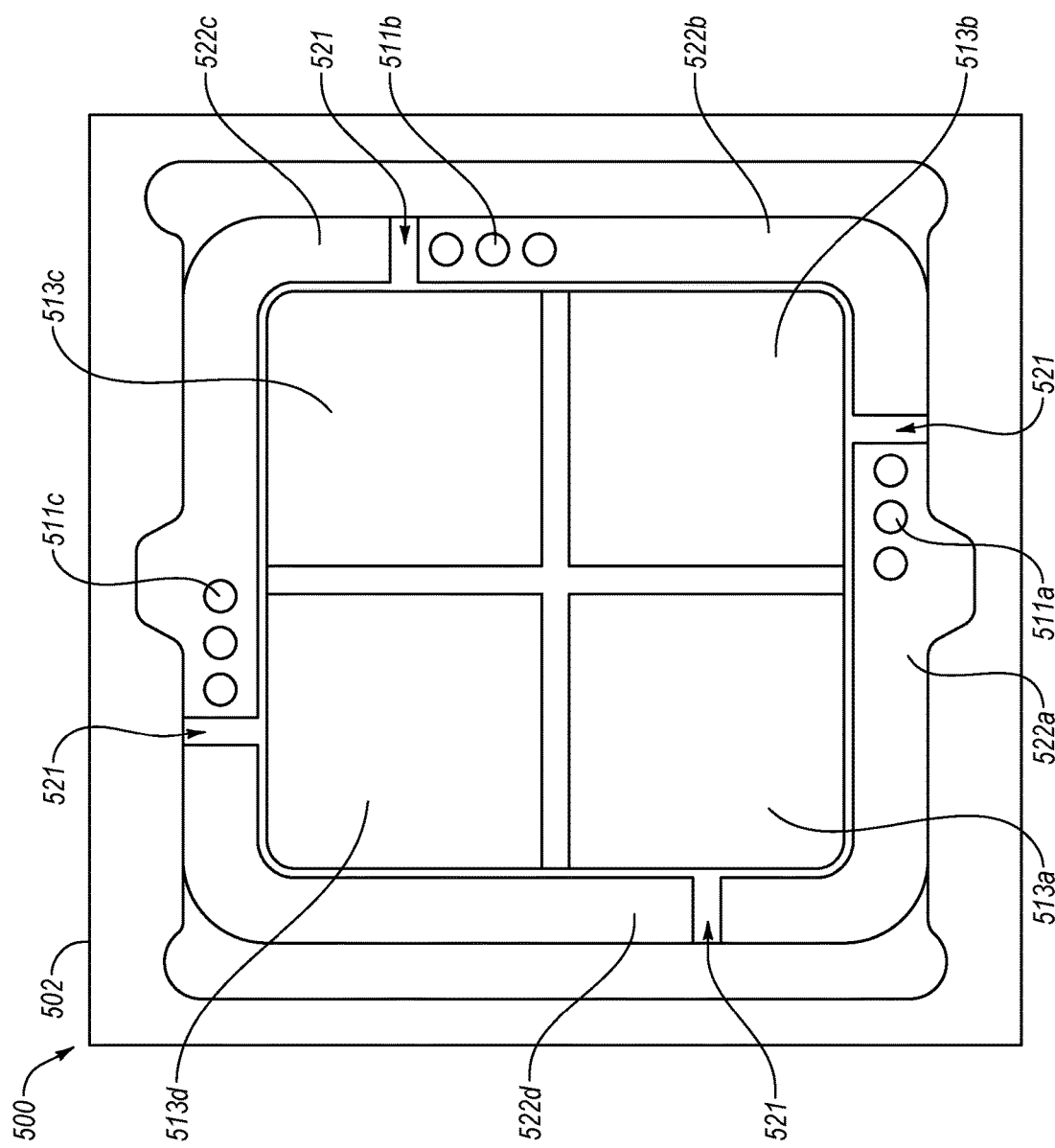
FIG. 5E illustrates a top view of the conductive pads of the emitter package of FIG. 5A.

FIG. 5E shows an electrical connection diagram. As shown, the cathode pad on the bottom of the bottom surface 544 (see FIG. 2F) can be electrically connected, such as through vias or electrical conduits (not shown), to the first conductive pad 513a (cathode), which is electrically connected through the first emitter chip 528a and a connector wire 530 to the first shelf contact pad 522a (anode), which is electrically connected through the first shelf vias 511a to the second conductive pad 513b (cathode), which is electrically connected through the second emitter chip 528b and a connector wire 530 to the second shelf contact pad 522b (anode), which is electrically connected through the second shelf vias 511b to the third conductive pad 513c (cathode), which is electrically connected through the third emitter chip 528c and a connector wire 530 to the third shelf contact pad 522c (anode), which is electrically connected through the third shelf vias 511c to the fourth conductive pad 513d (cathode), which is electrically connected through the fourth emitter chip 528d and a connector wire 530 to the fourth shelf contact pad 522d (anode), which is electrically connected to the anode pad on the bottom surface 544 (See FIG. 2F), such as through vias (not shown). Also, the first shelf contact pad 522a is separated from the second shelf contact pad 522b by a gap 521 (see FIG. 5E), which can be the body 502. The second shelf contact pad 522b is separated from the third shelf contact pad 522c by a gap 521, which can be the body 502. The third shelf contact pad 522c is separated from the fourth shelf contact pad 522d by a gap 521, which can be the body 502. The fourth shelf contact pad 522d is separated from the first shelf contact pad 522a by a gap 521, which can be the body 502.

While not shown, the contact shelf 510 has vias or other electrical conduits that electrically couple the shelf contact pad 522d to the base anode on the bottom surface 244 as shown in FIG. 2F. FIG. 2F also shows the base cathode 242 on the bottom surface 244 that is electrically coupled to the conductive pad 513a, such as through vias or other electrical conduits (not shown). Additionally, the shelf contact pads 522a,b,c,d and conductive pads 513a,b,c,d are electrically isolated from each other, such as by the ceramic material of the bottom side wall 520. As such, FIG. 2F may also represent the bottom view of the emitter package 500.

The top surface 504 and top side walls 516 are shown to form corner reliefs 550a,b,c,d, which are notches taken out of the corners to form the rounded portions. These corner reliefs 550a,b,c,d allow for the optic to be placed properly and to accommodate the corner of the optic. It is noted that relief 550d is larger, which can be used to denote the orientation of the emitter package 500; however, any relief can be larger or a different shape for orientation purposes (e.g., this can apply to all emitter packages). The optic edges are spaced from the top side walls 516.

Additionally, the top surface 504 and top side walls 516 are shown to form vents 552, which are notches in the top surface 504 and top side walls 516, and where two vents 552 are shown on opposite sides. This allows for ventilation from the emitter chip 528. It is noted that the optic does not cover the vents 552, so that there is an air gap to allow for circulation from outside of the emitter package 500 to the emitter chips 528. The electrical shelf contact pads 522a,c are shown to also have wings that extend into the notches that form the vents 552.

In one embodiment, the base surface 512 can include a lower surface or recess that is lower than the portions holding the emitter chips 528a,b,c,d. In reference to FIG. 5A, the region 512 may be lower than the region holding the conductive pads 513a,b,c,d. Such a lower surface or recess can enhance electrical isolation between the conductive pads 513a,b,c,d and shelf contact pads 522a,b,c,d. In one embodiment, the base surface 512 can include a raised surface or protrusion that is higher than the portions holding the emitter chips 528a,b,c,d. In reference to FIG. 5A, the region 512 may be higher than the region holding the conductive pads 513a,b,c,d. Such a higher surface or protrusion can enhance electrical isolation between the conductive pads 513a,b,c,d and shelf contact pads 522a,b,c,d.

Accordingly, emitter packages can be used for applications in 3D scanning, gesture detection, motion sensing, facial recognition, depth sensing, time-of-flight applications, light detection and ranging (LIDAR), biomedical sensing (e.g., eye sensing, fingerprint sensing, or other anatomical feature sensing), or other uses. A CMOS imager, CCD imager, or APD detector or other detectors can detect reflections of the emitter light for the functions described herein. As such, the emitter packages can be included in 3D scanning devices, gesture detection devices, motion sensing devices, facial recognition devices, depth sensing devices, time-of-flight application devices, light detection and ranging (LIDAR) devices, biomedical sensing (e.g., eye sensing, fingerprint sensing, or other anatomical feature sensing) devices, or other devices.

The emitter package can be prepared by any process that forms the unitary body, whether by deposition and etching, or by selective deposition, or by 3D printing.

In one embodiment, the emitter cavity can include one or more emitter (e.g., VCSEL) chips that can emit laser light for up to 200 meters, such as 100-200 meters, which can be used for long range applications (e.g., LIDAR). This can include hundreds or thousands of watts in peak power. When the emitter package includes a plurality of emitter chips in parallel, then the current requirement increases for each additional emitter chip, but the voltage stays the same. This can be problematic in various applications when current is limited (e.g., use in a mobile vehicles, such as a plane using LIDAR). Now, the present emitter package having the plurality of emitter chips can be in series so that the current stays substantially the same, but uses an increased voltage, which is often available (e.g., using 5-60 volts) to get higher power (e.g., 800 kilowatts).

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

The invention claimed is:

1. An emitter package comprising:
   a body having a bottom member, one or more side members extending from the bottom member, and a top surface, wherein the body defines a cavity formed into the top surface and located between the bottom member and the one or more side members;
   the cavity having one or more top side walls extending from the top surface to one or more contact shelves, and one or more bottom side walls extending from the one or more contact shelves to a base surface;
   a plurality of electrical conductive pads on the base surface in the cavity;
   a plurality of light emitter chips on the electrical conductive pads, each light emitter chip having one or more light emitters;
   an optic optically coupled with the light emitter chips;
   at least one anode pad and at least one cathode pad on a bottom surface of the bottom member;
   a plurality of shelf contact pads on the one or more contact shelves; and
   a plurality of electrical connector wires connected to and extending between the light emitter chips and the shelf contact pads,
   wherein the at least one cathode pad is electrically connected to a first of the electrical conductive pads, which is electrically connected through a first of the light emitter chips and a first of the electrical connector wires to a first of the shelf contact pads, which is electrically connected through one or more first shelf vias to a second of the electrical conductive pads, which is electrically connected through a second of the emitter chips and a second of the electrical connector wires to a second of the shelf contact pads.

2. The emitter package of claim 1, wherein the body that defines the cavity formed into the top surface and located between the bottom member and one or more side members is a unitary member.

3. The emitter package of claim 1, wherein one of the light emitter chips is disposed on each of the electrical conductive pads.

4. The emitter package of claim 1, comprising:
   four of the electrical conductive pads on the base surface in the cavity;
   one of the light emitter chips on each of the four electrical conductive pads; and
   four of the shelf contact pads on the one or more contact shelves.

5. The emitter package of claim 1, wherein the second shelf contact pad is electrically connected through one or more second shelf vias to a third of the electrical conductive pads, which is electrically connected through a third of the light emitter chips and a third of the electrical connector wires to a third of the shelf contact pads, which is electrically connected through one or more third shelf vias to a fourth of the electrical conductive pads, which is electrically connected through a fourth of the light emitter chips and a fourth of the electrical connector wires to a fourth of the shelf contact pads, which is electrically connected to the at least one anode pad.

6. The emitter package of claim 5, wherein:
   the at least one cathode pads is electrically coupled with the first of the electrical conductive pads through one or more vias or electrical conduits; and
   the at least one anode pad is electrically coupled with the second of the shelf contact pads through one or more other vias or electrical conduits.

7. The emitter package of claim 1, wherein:
   the electrical conductive pads are each electrically isolated from each other; and/or
   the shelf contact pads are each electrically isolated from each other.

8. The emitter package of claim 1, wherein the base surface includes one or more recessed regions or one or more raised regions around the electrical conductive pads.

9. The emitter package of claim 1, wherein each of the one or more emitters on the light emitter chips is configured to emit infrared light.

10. The emitter package of claim 1, wherein the body is formed of a plastic or ceramic.

11. A method of emitting one or more light beams, the method comprising:
    providing the emitter package of claim 1; and
    emitting light out of the cavity from the one or more light emitters of the light emitter chips.

12. A method of manufacturing the emitter package of claim 1, the method comprising:
    forming the body having the cavity;
    placing the electrical conductive pads on the base surface in the cavity;
    placing the light emitter chips on the electrical conductive pads;
    placing the shelf contact pads on the one or more contact shelves;
    electrically connecting the light emitter chips with the shelf contact pads with the electrical connector wires connected to and extending between the light emitter chips and the shelf contact pads; and
    depositing a transparent encapsulating material for the optic to encapsulate at least the light emitter chips and covering the base surface and at least partially filling the cavity.

13. The emitter package of claim 1, the optic comprises a transparent encapsulating material that encapsulates the light emitter chips and the base surface and at least partially fills the cavity.

14. The emitter package of claim 13, wherein the transparent encapsulating material fills the cavity.

15. The emitter package of claim 13, further comprising one or more optic shelves between the top surface and one or more contact shelves, wherein the transparent encapsulating material fills the cavity at least to the one or more optic shelves.

16. The emitter package of claim 13, wherein the transparent encapsulating material is a polymer.

17. The emitter package of claim 1, further comprising one or more optic shelves between the top surface and one or more contact shelves, wherein the optic comprises an optical element on and extending between the one or more optic shelves so as to cover at least a portion of the cavity.

18. The emitter package of claim 17, wherein the optical element is a diffuser on and extending between the one or more optic shelves so as to cover a portion of the cavity below the diffuser.

19. The emitter package of claim 1, wherein the second shelf contact pad is coupled either:
    through one or more series of the electrical conductive pads, the light emitter chips, the connector wires, and the shelf contact pads to the at least one anode pad; or
    to the at least one anode pad.

* * * * *